United States Patent
Chen et al.

(10) Patent No.: US 8,092,861 B2
(45) Date of Patent: Jan. 10, 2012

(54) METHOD OF FABRICATING AN ULTRA DIELECTRIC CONSTANT (K) DIELECTRIC LAYER

(75) Inventors: Mei-Ling Chen, Kaohsiung (TW); Su-Jen Sung, Hsinchu County (TW); Chien-Chung Huang, Taichung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 949 days.

(21) Appl. No.: 11/850,466

(22) Filed: Sep. 5, 2007

(65) Prior Publication Data
US 2009/0061201 A1    Mar. 5, 2009

(51) Int. Cl.
*C23C 16/30* (2006.01)
(52) U.S. Cl. ............ 427/248.1; 427/255.28; 427/255.31
(58) Field of Classification Search ............... 427/248.1, 427/255.28, 255.31
See application file for complete search history.

(56) References Cited

U.S. PATENT DOCUMENTS

| | | | |
|---|---|---|---|
| 6,080,640 A | 6/2000 | Gardner et al. | |
| 6,187,692 B1* | 2/2001 | Lan et al. | 438/778 |
| 6,465,372 B1* | 10/2002 | Xia et al. | 438/787 |
| 6,531,412 B2 | 3/2003 | Conti et al. | |
| 6,583,046 B1 | 6/2003 | Okada et al. | |
| 6,593,043 B2 | 7/2003 | Suwa et al. | |
| 6,784,101 B1 | 8/2004 | Yu et al. | |
| 6,798,043 B2* | 9/2004 | Steiner et al. | 257/637 |
| 6,805,139 B1 | 10/2004 | Savas et al. | |
| 6,905,981 B1* | 6/2005 | Todd et al. | 438/788 |
| 6,919,101 B2 | 7/2005 | Zhang et al. | |
| 7,015,581 B2* | 3/2006 | Casey et al. | 257/750 |
| 7,084,079 B2 | 8/2006 | Conti et al. | |
| 7,087,982 B2* | 8/2006 | Huang et al. | 257/642 |
| 7,125,790 B2 | 10/2006 | Low et al. | |
| 7,125,794 B2 | 10/2006 | Kondo et al. | |
| 7,138,333 B2 | 11/2006 | Schmidt et al. | |
| 7,176,144 B1* | 2/2007 | Wang et al. | 438/759 |
| 7,723,237 B2* | 5/2010 | Hyland et al. | 438/706 |
| 2003/0211244 A1* | 11/2003 | Li et al. | 427/255.28 |
| 2004/0126929 A1* | 7/2004 | Tang et al. | 438/118 |
| 2005/0048795 A1* | 3/2005 | Ko et al. | 438/778 |
| 2005/0255710 A1* | 11/2005 | You et al. | 438/780 |
| 2007/0173070 A1 | 7/2007 | Chen et al. | |
| 2007/0173071 A1* | 7/2007 | Afzali-Ardakani et al. | 438/781 |
| 2009/0280637 A1* | 11/2009 | Lee et al. | 438/618 |

FOREIGN PATENT DOCUMENTS

| | | |
|---|---|---|
| CN | 1716546 A | 1/2006 |
| JP | 2007258403 | * 10/2007 |
| TW | 200610054 A | 3/2006 |
| TW | 200729395 A | 8/2007 |

OTHER PUBLICATIONS

Yang, G.Y. et al., "Nanoporous Ultra-Low Dielectric Constant Materials". NISCT Center for Neutron Research Scientific Highlights, May 2002, no page numbers.*

(Continued)

*Primary Examiner* — Bret Chen
(74) *Attorney, Agent, or Firm* — Chun-Ming Shih (57) ABSTRACT

A fabrication method of an ultra low-k dielectric layer is provided. A deposition process is performed, under the control of a temperature varying program or a pressure varying program, by reacting a dielectric matrix to form porous low-k dielectric layers with a gradient density on a barrier layer over a substrate.

12 Claims, 9 Drawing Sheets

OTHER PUBLICATIONS

Kuo, Ming-Shu, et al., "Surface and near-surface modifications of ultralow dielectric constant materials exposed to plasmas under sidewall-like conditions". J. Vac. Sci. Technol. B 28(6), Nov./Dec. 2010, pp. 1104-1110.*

Park, S.J., et al., "Formation of nanoporous organosilicate films using cyclodextrins as a porogen". Current Applied Physics 6 (2006) 743-746.*

Rajagopalan, T., et al., "Supercritical carbon dioxide extraction of porogens for the preparation of ultralow-dielectric-constant films". Applied Physics Letters, vol. 82, No. 24, Jun. 16, 2003, pp. 4328-4330.*

Kim, Suhan, et al., "Effect of Pore Generating Materials on the Electrical and Mechanical Properties of Porous Low-k Films". Macromolecular Research, vol. 15, No. 1, Feb. 28, 2007, pp. 1-4.*

* cited by examiner

METHOD OF FABRICATING AN ULTRA DIELECTRIC CONSTANT (K) DIELECTRIC LAYER

BACKGROUND OF THE INVENTION

1. Field of Invention

The present invention relates to a dielectric layer and a method of fabricating the same; more particularly, the present invention relates to an ultra low dielectric constant (K) dielectric layer and a method of fabricating the same.

2. Description of Related Art

Due to the accelerated development of the integrated circuit (IC) process, the backend metal interconnect process and low dielectric constant (k) material process become increasingly significant. As IC process progresses to the deep submicron territory, the RC delay of metal interconnect seriously affects the operating speed of a device. Mitigating RC delay may be accomplished by using a low dielectric constant (k) material for the insulation layer of the multi-layer metal interconnect to reduce parasitic capacitance between metal layers.

A porous low-k dielectric layer is a dielectric material containing numerous voids therein. Since the dielectric constant of the air inside the voids is close to 1, the overall dielectric constant of the dielectric layer is greatly reduced to below about 2.5. This type of material is an ultra low k dielectric material.

Figure 6:
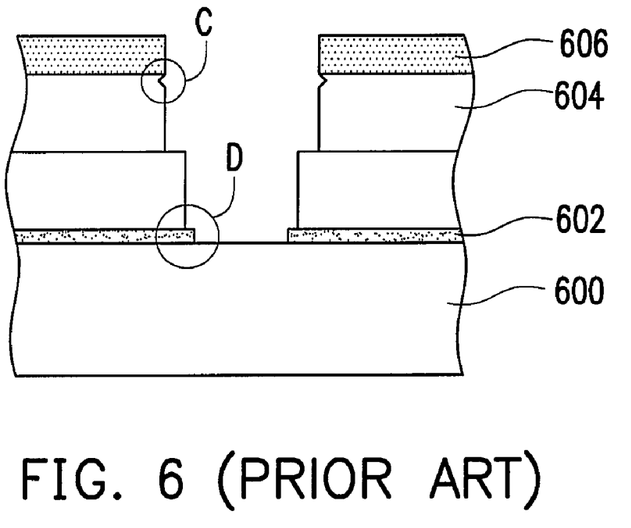
FIG. 6 is schematic, cross-sectional view diagram of a dielectric layer with the kink profile issue between the dielectric layer and the overlying and between the dielectric layer and the underlying layer subsequent to an etching process according to the prior art.

Although the porous dielectric thin film provides a low k value, the porous characteristic may increase the complexity in integrating the copper conductive line process. First of all, the porous structure weakens the mechanical strength of a thin film, and the shear stress resulted from a chemical mechanical polishing process poses a challenge to the inherent weakness of the porous dielectric thin film. As shown in FIG. 6, the application of a porous low dielectric constant (k) dielectric layer in a semiconductor process is typically implemented by forming a dielectric barrier layer 602 on a substrate 600 before forming the porous low-k dielectric layer 604. After the formation of the porous low k dielectric layer 604, a silicon oxide cap layer 606 is formed covering the porous low k dielectric layer 604. A deposition process in forming the porous low k dielectric layer is commonly performed under a single temperature and a single pressure. However, the adhesion property at the interface between the porous low k dielectric layer 604 formed according to the conventional deposition process and the dielectric barrier layer 602 or the cap layer 606 is undesirable. The adhesion strength is normally smaller than 5 joules/cm$^2$. In the subsequent etching process, lateral etching is generated at the interface between the porous low k dielectric layer and the dielectric barrier layer or the interface between the porous low k dielectric layer and the silicon oxide cap layer (as depicted by the D, C regions in the Figure) due to insufficient mechanical strength and differences in the etching selectivity. Hence, kink profile issue is resulted to adversely affect the step coverage of the metal dielectric barrier deposited in the dual damascene opening. Ultimately, voids are formed and the electrical performance and reliability of the metallization process are compromised.

SUMMARY OF THE INVENTION

The present invention is to provide a dielectric layer, wherein the dielectric layer is a porous low dielectric constant (k) dielectric layer having an ultra low dielectric constant. Further, the adhesion property of the dielectric layer between that and the overlying layer and the underlying layer is desirable.

The present invention is to provide a dielectric layer that includes a porous low-k dielectric layer having an ultra low dielectric constant, wherein the kink profile issue between the dielectric layer and the overlying layer and the underlying layer is mitigated.

The present is to provide a dielectric layer that includes a porous low-k dielectric layer having an ultra low dielectric constant, wherein the dielectric layer has desirable electrical efficiency and reliability.

The present invention is to provide a method for fabricating an ultra low-k dielectric layer. The method includes performing a deposition process employing a dielectric matrix, wherein the process is controlled by a temperature varying program or a pressure varying program, and the dielectric matrix is reacted to form multiple layers of porous low-k dielectric layers with a gradient density on the dielectric barrier layer on the substrate.

According to an embodiment of the present invention, in the fabrication of the above ultra low dielectric constant (k) dielectric layer, the temperature varying program is a gradient temperature varying program.

According to an embodiment of the present invention, in the fabrication of the above ultra low dielectric constant (k) dielectric layer, the gradient temperature varying program includes two temperatures steps encompassing a low temperature step and a high temperature step.

According to an embodiment of the present invention, in the fabrication of the above ultra low dielectric constant (k) dielectric layer, the low temperature step is conducted at a temperature between about 200 to about 250 degrees Celsius, while the high temperature step is conducted at a temperature between about 250 to about 350 degrees Celsius.

According to an embodiment of the present invention, in the fabrication of the above ultra low dielectric constant (k) dielectric layer, the gradient temperature varying program includes performing the high temperature step, followed by the low temperature step to mitigate the kink profile issue between the ultra low dielectric constant dielectric layer and the overlying layer.

According to an embodiment of the present invention, in the fabrication of the above ultra low-k dielectric layer, the gradient temperature varying program includes performing the low temperature step, followed by the high temperature step in increase the breakdown voltage of the device.

According to an embodiment of the present invention, in the fabrication of the above ultra low dielectric constant (k) dielectric layer, the gradient temperature varying program includes three temperature steps.

According to the fabrication method for the above ultra low dielectric constant (k) dielectric layer of an embodiment of the present invention, the three temperature steps include sequentially a first low temperature step, a high temperature step and a second low temperature step to reduce the stress of the porous low-k dielectric layer.

According to an embodiment of the present invention, in the fabrication of the above ultra low-k dielectric layer, the first and the second low temperature steps are conducted at a temperature of about 200 to about 230 degrees Celsius, while the high temperature step is conducted at a temperature of about 230 to about 400 degrees Celsius.

According to an embodiment of the present invention, in the fabrication of the above ultra low-k dielectric layer, the pressure varying program includes a gradient pressure varying program.

According to an embodiment of the present invention, in the fabrication of the above ultra low-k dielectric layer, the gradient pressure varying program includes three pressure steps.

According to an embodiment of the present invention, in the fabrication of the above ultra low dielectric constant (k) dielectric layer, the three pressure steps include a first low pressure step, a high pressure step and a second low pressure step to improve the electrical efficiency or stability of the porous low dielectric constant dielectric layers.

According to an embodiment of the present invention, in the fabrication of the above ultra low dielectric constant (k) dielectric layer, the first and the second low pressure steps are respectively conducted at a pressure of about 1 to 9 torrs, while the high pressure step is conducted at a pressure of about 9 to 20 torrs.

According to the fabrication method for of above ultra low-k dielectric layer of an embodiment of the present invention, during the front end process of the first low pressure step, a dielectric matrix that includes a backbone precursor but not a porogen species to form a first rigid low-k dielectric layer is provided. During the backend process of the first low pressure step, the high pressure step and the front end process of the second low pressure step, a dielectric matrix that includes the backbone precursor and the porogen species to form a porous low-k dielectric layer is provided. During the backend process of the second low pressure step, the dielectric matrix that includes the backbone precursor but not the porogen species to form the second rigid, low-k dielectric layer is provided.

According to an embodiment of the present invention, in the fabrication of the above ultra low-k dielectric layer, a single frequency radio frequency power or a dual frequency radio frequency power is used in performing the deposition process.

The present invention provides a dielectric layer, wherein the dielectric layer includes an ultra low-k dielectric layer disposed on a dielectric barrier layer above a substrate. The ultra low-k dielectric layer includes multiple layers of porous low k dielectric layer, wherein these ultra low-k dielectric layers have a gradient density.

According to the above dielectric layer of an embodiment of the present invention, the density of the porous low-k dielectric layers, among the multiple layers of the porous low-k dielectric layer, that are in proximity of the dielectric barrier layer is higher than the density of the porous low-k dielectric layers that are distant from the dielectric barrier layer.

According to the above dielectric layer of an embodiment of the present invention, the porous low-k dielectric layers include sequentially from the bottom to the top a first rigid low-k dielectric layer, a first porous low-k dielectric layer and a second rigid low-k dielectric layer to form a sandwich stacked layer. Further, the density of the first rigid low-k dielectric layer and the density of the second rigid low-k dielectric layer are higher than that of the first porous low-k dielectric layer.

According to an embodiment of the present invention, the above dielectric layer further includes a cap layer covering the ultra low k dielectric layer.

According to the above dielectric layer of an embodiment of the present invention, the cap layer includes a silicon oxide layer.

According to the fabrication method of an ultra low-k dielectric layer of an embodiment of the present invention, the porous low-k dielectric layers have an ultra low dielectric constant.

According to the fabrication method of an ultra low-k dielectric layer of an embodiment of the present invention, the adhesion between the ultra low-k dielectric layer and the overlying layer and the underlying layer are desirable.

According to the fabrication method for an ultra low-k dielectric layer of an embodiment of the present invention, the kink profile issue between the ultra low k dielectric layer and the overlying layer and the underlying layer is mitigated.

According to the fabrication method for an ultra low-k dielectric layer of an embodiment of the present invention, the porous low-k dielectric layers having an ultra low dielectric constant has low tensile stress.

According to the fabrication method for an ultra low-k dielectric layer of an embodiment of the present invention, the porous low-k dielectric layer with an ultra low dielectric constant has desirable or stable electrical efficiency and stability.

Further, the method for fabricating the dielectric layer of an embodiment of the present invention is simple and easy to control.

In order to make the aforementioned and other objects, features and advantages of the present invention comprehensible, a preferred embodiment accompanied with figures is described in detail below.

DESCRIPTION OF EMBODIMENTS

Figure 1:
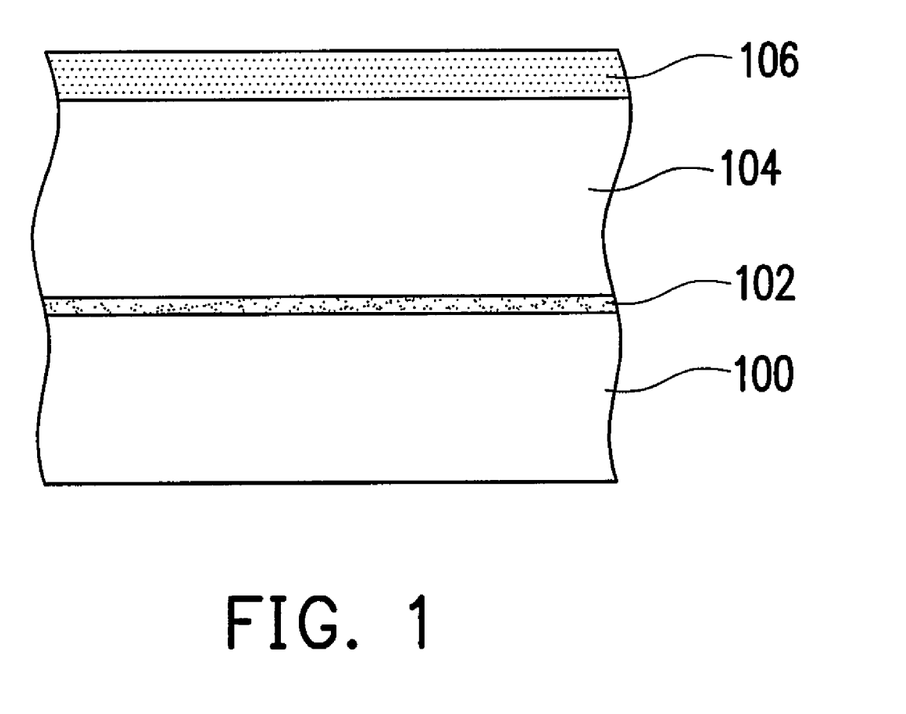
FIG. 1 is a schematic, cross-sectional view diagram of a dielectric layer according to an embodiment of the present invention.

Referring to FIG. 1, a substrate 100 is provided, and the substrate 100 includes a dielectric barrier layer 102 already formed thereon. The material of the dielectric barrier layer 102 includes SiCN, SiC, SiN, for example. Forming the dielectric barrier layer 102 is accomplished by reacting a silane type precursor, such as tetramethylsilane ($(SiCH_3)_4$) or trimethylsilane ($Si(CH_3)_3H$) with the appropriate reacting gases. Thereafter, an ultra low dielectric constant (k) dielectric layer 104 is formed on the dielectric barrier layer 102. The ultra low-k dielectric layer includes multiple porous low-k dielectric layers. These porous low-k dielectric layers may form by chemical vapor deposition (CVD), for example, which includes but not limited to plasma enhanced chemical vapor deposition (PECVD). The deposition process is under the control of a temperature varying program or a pressure varying program to provide the porous low-k dielectric layers with different physical characteristics, such as density or stress. During the deposition of the multi porous low k dielectric layers, a dielectric matrix, which may include a backbone precursor and porogen species, or a backbone precursor alone is being provided. The backbone precursor includes but not limited to organosilicate based precursor. The organosilicate based precursor includes tetra-methylcyclotetrasiloxanes (TMCTS), methyldimethoxysilane (DMDMOS), diethoxymethylsilane (DEMS), octamethylcyclotetrasiloxane (OMCTS), etc.

TMCTS    DMDMOS

DEMS    OMCTS

The porogen species influences the void diameter of the voids formed in the porous low-k dielectric layers. In general, the porogen species can be eliminated by an irradiation of violet light subsequent to the deposition process. In selecting the porogen species, it is necessary to consider the dielectric constant and the mechanical strength required for the dielectric layer. The selected porogen species may allow the porous low-k dielectric layer formed with voids having a void diameter lower than 100 angstroms, for example, lower than 30 angstroms. The porogen species includes, for example organic hydrocarbon compound, such as $C_xH_y$, wherein $4 \leq x \leq 30$, and $5 \leq y \leq 50$. Examples for $C_xH_y$ include:

A Compound

B Compound

C Compound

In one embodiment, the selected porogen species is the A compound, and the void diameter of the voids in the porous low-k dielectric layer is about 13 angstroms. In one embodiment, the selected porogen species is the B compound, and the void diameter of the voids in the porous low-k dielectric layer is about 14 angstroms. In one embodiment, the selected porogen species is the B compound, and the void diameter of the voids in the porous low-k dielectric layer is about 15 angstroms.

Thereafter, a cap layer 106 is formed on the ultra low-k dielectric layer 104. The material that constitutes the cap layer 106 includes but not limited to silicon oxide. Methods used in forming silicon oxide include plasma enhanced chemical vapor deposition (PECVD), for example, using a gas source, such as tetraethoxysilane (TEOS) or silane. The porous low-k dielectric layer 104 having different physical characteristics, formed under the control of the temperature varying program or the pressure varying program, has good adhesion with the overlying cap layer 106 and the underlying dielectric barrier layer 102. The kink profile issue between the porous low-k dielectric layer 104 and the overlying cap layer 106, and between the porous low-k dielectric layer 104 and the underlying dielectric barrier layer 102 is mitigated, or stress is reduced, or the electrical performance and reliability is enhanced.

The fabrication of an ultra low-k dielectric layer formed under the control of the temperature varying program or the pressure varying program of the present invention now will be described hereinafter by way of the following embodiments. It should be appreciated that this invention may be embodied in many different forms and should not be construed as limited to the embodiments set forth herein.

Figure 2:
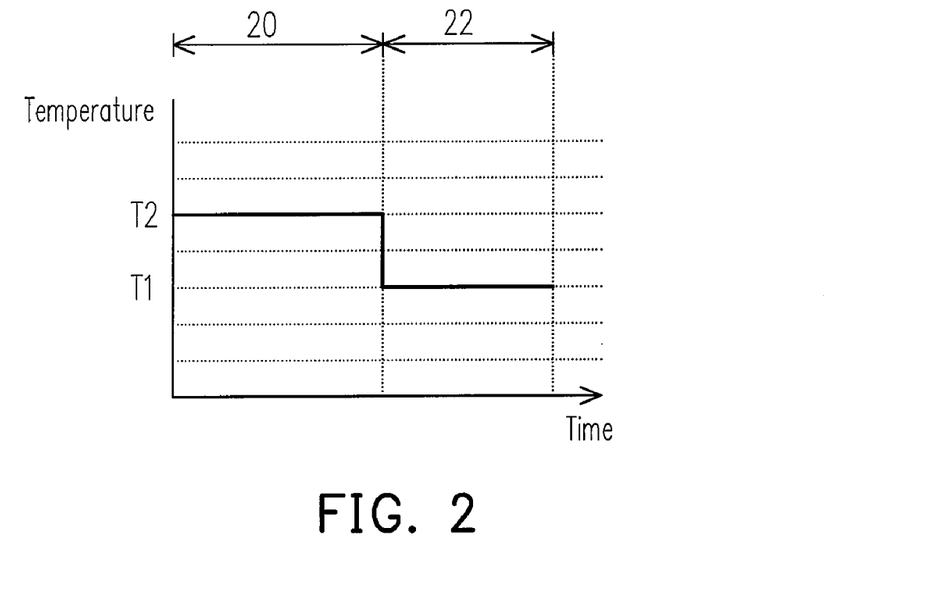
FIG. 2 is a schematic diagram illustrating a deposition process performed with a two-step, temperature varying program with a high temperature step followed by a low temperature step according to a first embodiment of the present invention.
Figure 3:
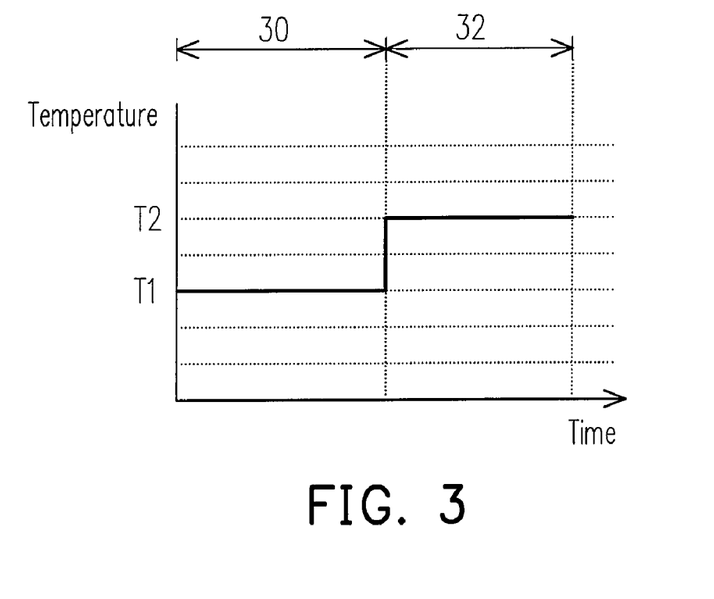
FIG. 3 is a schematic diagram illustrating a deposition process performed with a two-step, temperature varying program with a high temperature step followed by a low temperature step according to a second embodiment of the present invention.
Figure 4:
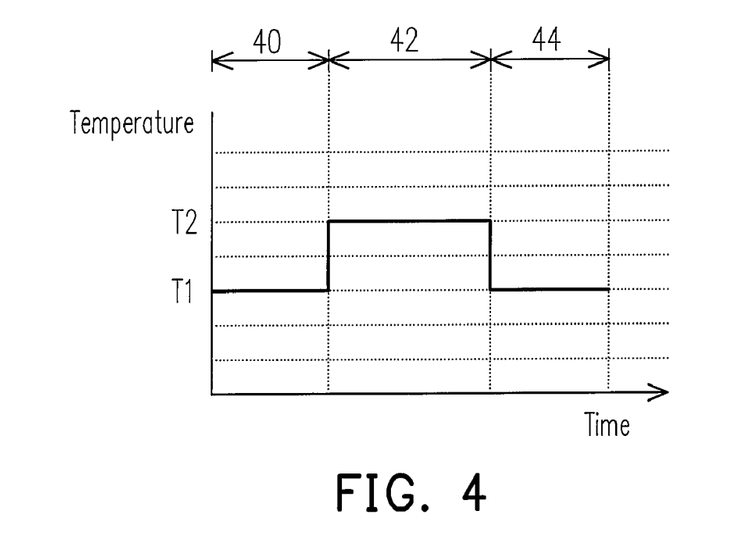
FIG. 4 is a schematic diagram illustrating a deposition process performed with a three-step temperature varying program with a low temperature step, followed by a high temperature step and then by a low temperature step according to a third embodiment of the present invention.

Referring to FIGS. 2, 3 and 4, the fabrication method of the porous low k dielectric layer includes introducing a dielectric matrix comprising a backbone precursor and a porogen species during the deposition process. Further, the deposition is controlled under a temperature varying program to provide a porous low-k dielectric layer having different physical characteristics. In this embodiment, the temperature varying program is a gradient temperature varying program which includes two temperature steps or three temperature steps.

First Embodiment

In this embodiment, the temperature varying program includes a gradient temperature program having two temperature steps as shown in FIG. 2. In FIG. 2, the two temperature steps include sequentially a first temperature step 20 and a second temperature step 22, wherein the first temperature step 20 is a high temperature step, while the second temperature step 22 is a low temperature step. The temperature at each temperature step 20, 22 is depended on the dielectric matrix. The first temperature step 20 in the first embodiment is conducted at a temperature of about 250 to about 350 degrees Celsius, while the second temperature step 22 is conducted at a temperature of about 200 to 250 degrees Celsius. In one embodiment, during the first temperature step 20 and the second temperature step 22 of the deposition process, the same backbone precursor and the same porogen species are being used.

The various steps 20, 22 may be performed in-situ at the same deposition station or non in-situ at different deposition stations. For example, when there are four deposition stations in one deposition chamber, the ratio of the deposition station used for the first temperature step 20 to that for the second temperature step 22 may be 1:3, 2:2 or 3:1. If the time at each deposition station is fixed, the ratio of the deposition time for the first temperature step 20 to that for the second temperature step 22 is 1:3, 2:2 or 3:1. If a plurality of deposition chambers is arranged in series, more deposition stations are available. The number of deposition station and the deposition time for the first temperature step 20 and the second temperature step 22 can be modified according to the actual demands and requirements.

Figure 2A:
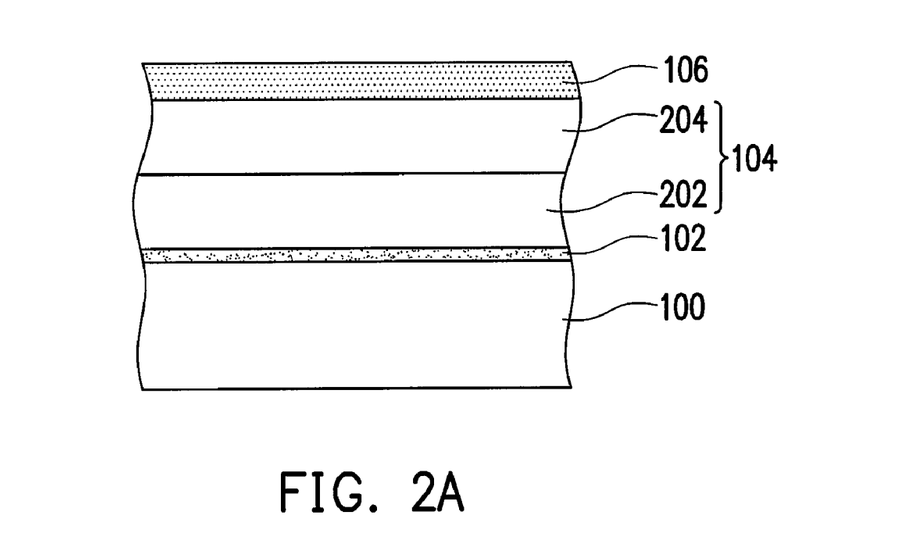
FIG. 2A is a schematic, cross-sectional view diagram of a dielectric layer formed according to a deposition process performed with a two-step, temperature varying program with a high temperature step followed by a low temperature step according to a first embodiment of the present invention.

FIG. 2A is a schematic view of two porous low-k dielectric layers 202, 204 having different densities, wherein the two porous low-k dielectric layers 202, 204 are sequentially formed according a deposition process subjected to a temperature varying program of a high temperature step, followed by a low temperature step. The dielectric layer 202 formed in the high temperature step has a higher porosity density, while the dielectric layer 204 formed in the low temperature step has a lower porosity density.

Figure 2B:
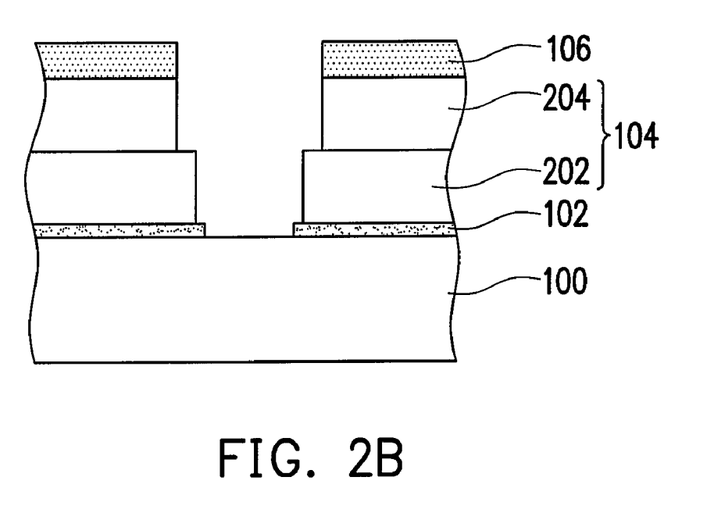
FIG. 2B is a schematic, cross-sectional view diagram of a dielectric layer subsequent to an etching process in which the kink profile issue between the dielectric layer and the overlying is resolved, wherein the dielectric layer is formed according to the first embodiment of the present invention.

Referring to FIG. 2B, experimental results confirm that a deposition process conducted with a high temperature step followed by a low temperature step, the kink profile issue between the multi-layer, porous low-k dielectric layer 104 and the overlying cap layer 106 is effectively improved during the subsequent etching process.

In one embodiment, during each step of the deposition process, a single frequency radio frequency power is applied. In other words, only the high frequency radio frequency power is turned on, while the low frequency radio frequency power is turned off. In another embodiment, dual frequency radio frequency power is employed in each temperature step. In essence, during the deposition process, low frequency radio frequency power and high frequency radio frequency power are concurrently turned on. The power of the low frequency radio frequency power is about 200 W to about 2500 W, for example, and the frequency is about 100 KHz to about 500 KHz, for example. The power of the high frequency radio frequency power is 2000 W to about 5000 W, for example, and the frequency is about 10 MHz to about 50 MHz, for example. Using the dual frequency radio frequency power to perform each step of the deposition process, the step coverage of the metal barrier layer at the interface between the dielectric barrier layer and the porous low-k dielectric layer 104 (the porous low-k dielectric layer 202) is improved when the metal barrier layer is deposited in a dual damascene opening. The mechanical strength of the porous low-k dielectric layer 104, the adhesion property and the etching selectivity between the porous low-k dielectric layer 104 and the barrier layer 102 are also reinforced.

Figure 2C:
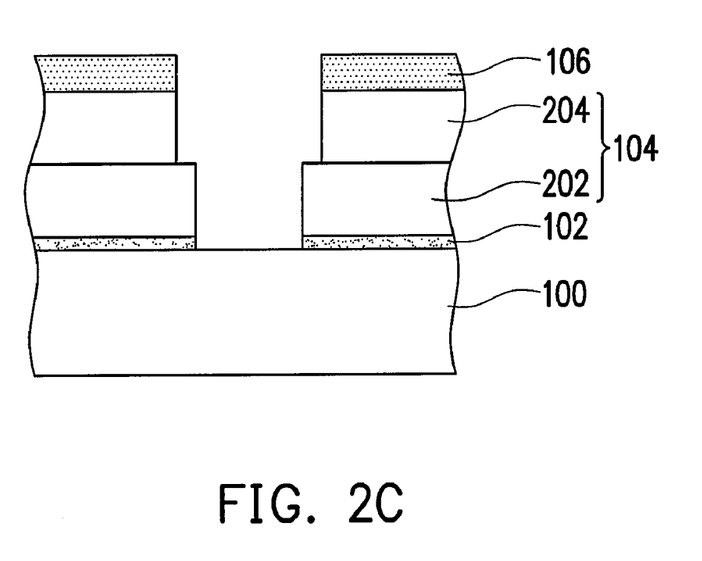
FIG. 2C is a schematic, cross-sectional view diagram of a dielectric layer subsequent to an etching process in which the kink profile issue between the dielectric layer and the overlying and between the dielectric layer and the underlying layer is resolved, wherein the dielectric layer is formed according to the first embodiment of the present invention.

Referring to FIG. 2C, experimental results confirmed that using the dual frequency radio frequency power to perform each step of the deposition process, the kink profile issue between the porous low-k dielectric layer 104 and the overlying layer and between the porous low-k dielectric layer 104 and the underlying layer in the subsequent etching process is improved.

In the above embodiment, a temperature varying program that includes a high temperature step followed by a low temperature step is described. This invention may, however, be embodied in many different forms and should not be construed as limited to the embodiments set forth herein. The temperature varying program that includes multiple cycles of high and low temperature steps may be employed in the deposition process.

Second Embodiment

In this embodiment, as shown in FIG. 3, the temperature varying program includes a gradient temperature program having two temperature steps. As shown in FIG. 3, the two temperature steps include sequentially a first temperature step 30 and a second temperature step 32, wherein the first temperature step 30 is a low temperature step, and the second temperature step is a high temperature step 32. The temperature at each step 30, 32 is depended on the dielectric matrix. In one embodiment, the temperature of the low temperature step is about 200 to 250 degrees Celsius, while the temperature of the high temperature step is about 250 to 350 degrees Celsius. In one embodiment, the same backbone precursor and the same porogen species are used in the first temperature step 30 and the second temperature step of the deposition process.

The various steps 30, 32 may be performed in-situ at the same deposition station or non in-situ at different deposition stations. The duration for each step may be adjusted according to the deposition station or the demands of the process. For example, when there are four deposition stations in one deposition chamber, the ratio of the deposition station used for the first temperature step 20 to that for the second temperature step 22 may be 1:3, 2:2 or 3:1. If the deposition time at each deposition station is fixed, the ratio of the deposition time for the first temperature step 20 to that of the second temperature step 22 is 1:3, 2:2 or 3:1. If a plurality of deposition chambers is arranged in series, more deposition stations are available. The number of deposition station and the deposition time for the first temperature step 20 and the second temperature step 22 can be modified according to the actual demands and requirements.

Figure 3A:
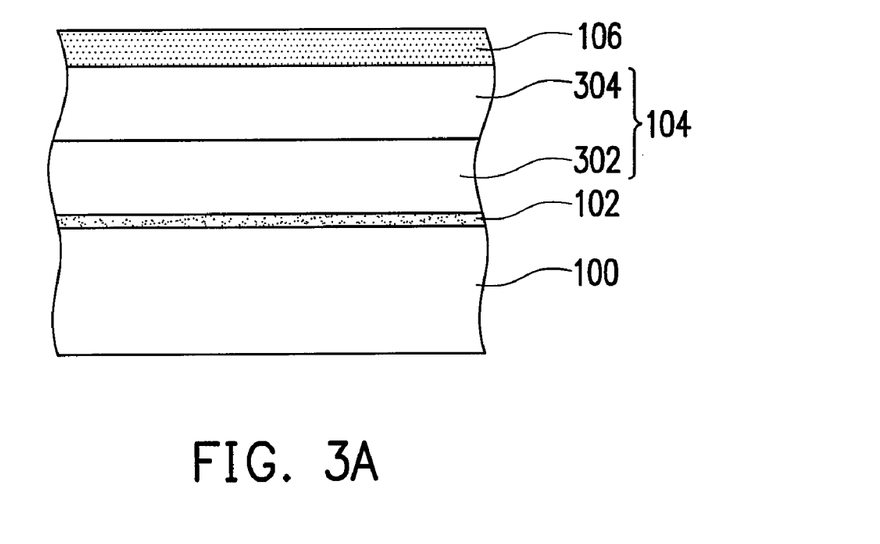
FIG. 3A is a schematic, cross-sectional view diagram of a dielectric layer formed according to a deposition process performed with a two-step, temperature varying program with a high temperature step followed by a low temperature step according to a second embodiment of the present invention.

FIG. 3A is a schematic view of two porous low-k dielectric layers 302, 304 having different densities, wherein the two porous low k dielectric layers 302, 304 are formed according a deposition process controlled under a temperature varying program that includes performing a high temperature step first, followed by a low temperature step. The density of the porous low-k dielectric layer 302 is higher than the density of the porous low k dielectric layer 304. In essence, the dielectric layer 104 is a porous low-k dielectric layer that is dense at the bottom and is loose at the top.

Figure 3B:
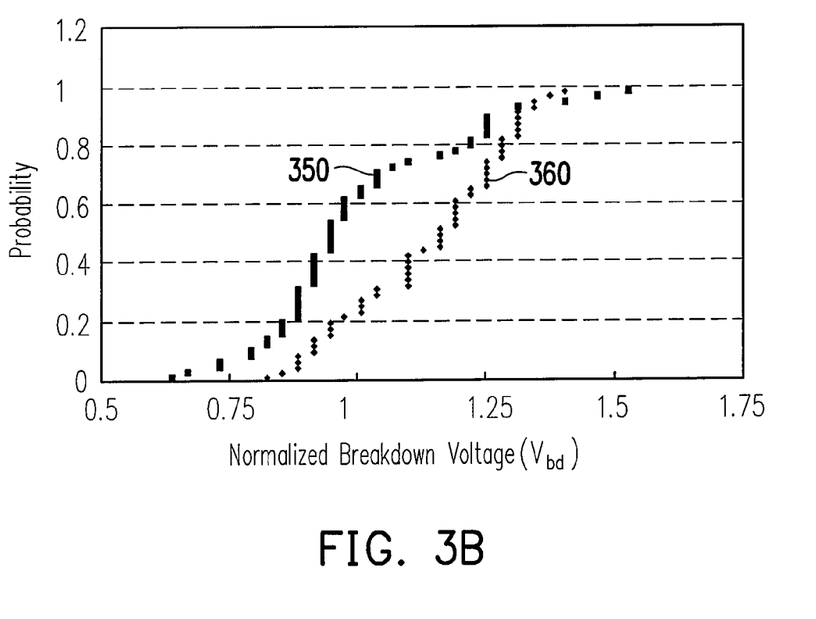
FIG. 3B is diagram illustrating a relationship between a normalized breakdown voltage of a dielectric layer and probability, wherein the dielectric layer is formed by a single temperature deposition process or by a two-step temperature varying program with a low temperature step followed by a high temperature step.

The curves 350, 360 in FIG. 3B respectively illustrate the relationship between the normalized breakdown voltage (Normalized $V_{bd}$) of a porous low-k dielectric layer and probability, wherein the porous low-k dielectric layer is formed by a single temperature deposition process or by a two-step temperature varying program that includes a low temperature step followed by a high temperature step. Experimental results confirm that a deposition process conducted with a temperature varying program that includes a low temperature step first followed by a high temperature step, the breakdown voltage ($V_{bd}$) of the about 90% of the porous low-k dielectric layer can be effectively increased by 18% (about 20%) to enhance the reliability of the device.

In one embodiment, during each step of the deposition process, a single frequency radio frequency power is applied, for example, only the high frequency radio frequency power is activated, while the low frequency radio frequency power is turned off. In another embodiment, a dual frequency radio frequency power is employed in each temperature step. In essence, during the deposition process, the low frequency radio frequency power and the high frequency radio frequency power are concurrently turned on. The power of the low frequency radio frequency power is about 200 W to about 2500 W, for example, and the frequency is about 100 KHz to about 500 KHz, for example. The power of the high frequency radio frequency power is 2000 W to about 5000 W, for example, and the frequency is about 10 MHz to about 50 MHz, for example. Using the dual frequency radio frequency power to perform each step of the deposition process, the step coverage of the metal barrier layer at the interface between the dielectric barrier layer and the porous low-k dielectric layer 104 (the porous low-k dielectric layer 302) is improved when the metal barrier layer is deposited in a dual damascene opening. The mechanical strength of the porous low-k dielectric layer 104, the adhesion property and the etching selectivity between the porous low-k dielectric layer 104 and the barrier layer 102 are also reinforced. Experimental results confirm that using dual radio frequency power to perform each step of the deposition process, the kink profile issue between the porous low-k dielectric layer 104 and the overlying layer 102 and the underlying layer 106 in the subsequent etching process can be improved.

In the above embodiment, a temperature varying program that includes a low temperature step followed by a high temperature step is described. This invention may, however, be embodied in many different forms and should not be construed as limited to the embodiments set forth herein. The temperature varying program that includes multiple cycles of high and low temperature steps may be employed in the deposition process.

Third Embodiment

In this embodiment, the temperature varying program includes a gradient temperature program having three temperature steps as shown in FIG. 4. In FIG. 4, the three temperature steps include sequentially a first temperature step 40, a second temperature step 42 and a third temperature step 44, wherein the first temperature step 40 is a low temperature step, the second temperature step 42 is a high temperature step and a third temperature step 44 is a low temperature step. The temperature of the second temperature step 42 is higher than those of the first temperature step 40 and the third temperature step 44. The temperature of the first temperature step 40 may be the same as or different from the temperature of the third temperature step 44. In the FIG. 4, only the temperature of the first temperature step 40 being the same as that of the second temperature step 44 is illustrated. The temperature at each temperature step is depended on the dielectric matrix. In one embodiment, the temperature of the low temperature step of the first temperature step 40 is about 200 to 230 degrees Celsius, while the temperature of the high temperature step of the second temperature step is about 230 to about 400 degrees Celsius. The low temperature step of the third temperature step 44 is conducted at about 200 to about 230 degrees Celsius. In one embodiment, during the deposition process, the same backbone precursor and the same porogen species are provided for the first temperature step 40, the second temperature step 42 and the third temperature step 44.

The various steps 40, 42 and 44 may be performed in-situ at the same deposition station or non in-situ at different deposition stations. The processing time for each step may be adjusted according to the deposition station or the demands of the process. For example, when there are four deposition stations in one deposition chamber, the ratio of the deposition station used for the first temperature step 40 to that for the second temperature step 42 and to that for the third temperature step 44 may be 1:2:1, 2:1:1 or 1:1:2. If the deposition time at each deposition station is fixed, the ratio of the processing time for the first temperature step 40 to that of the second temperature step 42 and to that of the third temperature step is 1:2:1, 2:1:1 or 1:1:2. If a plurality of deposition chambers is arranged in series, more deposition stations are available. The number of deposition station and the deposition time for the first temperature step 40, the second temperature step 42 and the third temperature step 44 can be modified according to the actual demands and requirements.

Figure 4A:
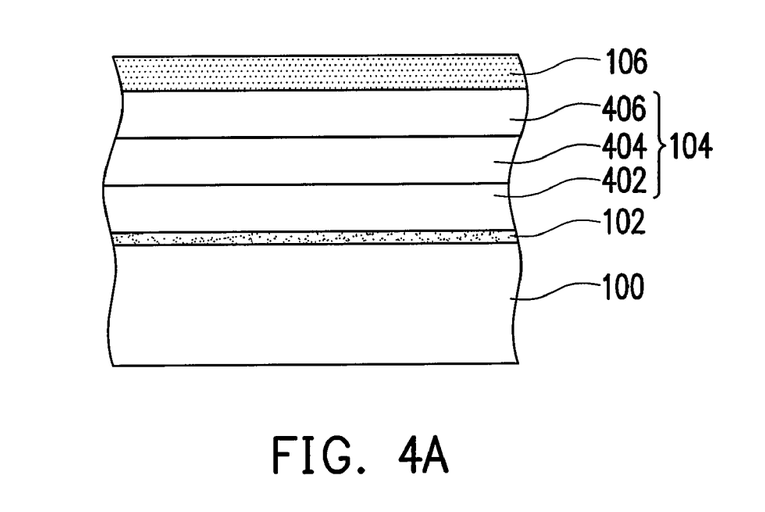
FIG. 4A is a schematic, cross-sectional view diagram of a dielectric layer formed according to a deposition process performed with a three-step, temperature varying program with a low temperature step, followed by a high temperature step and then a low temperature step according to a third embodiment of the present invention.

FIG. 4A is a schematic view of the porous low-k dielectric layers 402, 404, 406 having different densities, wherein the porous low-k dielectric layers 402, 404 and 406 are sequentially formed according a deposition process conducted under a three-step temperature varying program that encompasses a low temperature step, a high temperature step and a low temperature step. The dielectric layer 404 formed by the high temperature step has a porosity density higher than those of the dielectric layer 402 and the dielectric layer 406 formed by the low temperature steps.

Figure 4B:
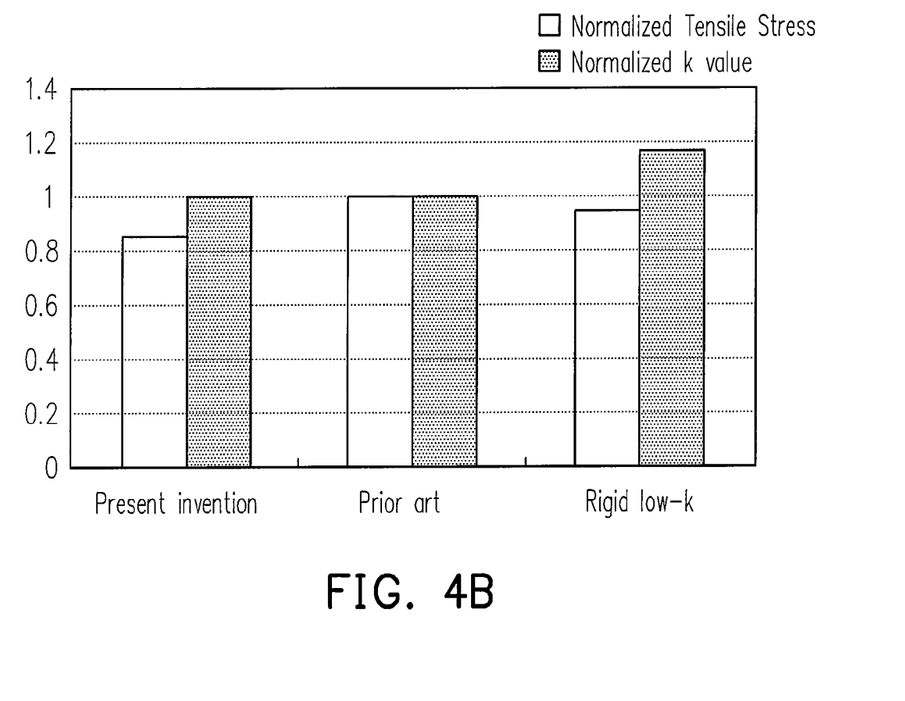
FIG. 4B is a bar diagram illustrating the normalized tensile stress and the normalized dielectric constant respectively for a porous low-k dielectric layer formed according to a deposition process performed with a three-step, temperature varying program with a low temperature step followed by a high temperature step and then a low temperature step, a porous low-k dielectric layer formed according to the conventional single temperature deposition process, and for a rigid low-k dielectric layer.

FIG. 4B is a bar diagram illustrating the normalized tensile stress and the normalized dielectric constant respectively for a porous low-k dielectric layer formed according to a deposition process using a three-step temperature varying program with a low temperature step followed by a high temperature step and then a low temperature step, for a porous low-k dielectric layer formed according the conventional single-temperature deposition process and for a rigid low-k dielectric layer formed according to the conventional single temperature deposition process. Experimental results suggest that not only the density of the porous low-k dielectric layer formed according to the three-step temperature varying program with a low temperature step, a high temperature step and a low temperature step may vary, the dielectric constant of the porous low-k dielectric layer is very close to the dielectric constant of the porous low-k dielectric layer formed according to the typical single-temperature deposition process, wherein the k value is about 2.56. On the other hand, the tensile stress of the dielectric layer formed according to the three-step temperature varying program with a low temperature, a high temperature step and a low temperature step is effectively reduced by 17%, which is from 62 MPa to about 52 MPa. It is worthy to note that the tensile stress of the dielectric layer (57 MPa) formed according to the three-step temperature varying program is smaller than that of the rigid low-k dielectric material. Additionally, the dielectric constant (k=2.56) of the porous low k dielectric layer formed according to the three-step temperature varying program is lower than that of the rigid low-k dielectric layer (k=3.02); yet, the kink profile issue with the underlying dielectric barrier layer is effectively improved.

In one embodiment, during each step of the deposition process, a single frequency radio frequency power is used. For example, only the high frequency radio frequency power source is turned on, while the low frequency radio frequency power is turned off. In another embodiment, a dual frequency radio frequency power is employed in each temperature step. In essence, during the deposition process, the low frequency radio frequency power source and the high frequency radio frequency power source are concurrently turned on. The power of the low frequency radio frequency power is about 200 W to about 2500 W, for example, and the frequency is about 100 KHz to about 500 KHz, for example. The power of the high frequency radio frequency power is about 2000 W to about 5000 W, for example, and the frequency is about 10 MHz to about 50 MHz, for example. Using the dual frequency radio frequency power to perform each step of the deposition process, the step coverage of the metal barrier layer at the interface between the dielectric barrier layer and the porous low-k dielectric layer 104 (the porous low-k dielectric layer 402) is improved when the metal barrier layer is deposited in a dual damascene opening. The mechanical strength of the porous low-k dielectric layer 104, the adhesion property and the etching selectivity between the porous low-k dielectric layer 104 and the barrier layer 102 are also reinforced. Experimental results confirm that the kink profile issue between the porous low k dielectric layer 104 and the upper 102 or lower layer 102 is effectively improved.

In the above embodiment, a temperature varying program that includes a high temperature step followed by a low temperature step and a high temperature step is described. This invention may, however, be embodied in many different forms and should not be construed as limited to the embodiments set forth herein. The temperature varying program that includes multiple cycles of high and low temperature steps may be employed in the deposition process.

Moreover, in the above three embodiments, deposition processes that include a two-step temperature varying program and a three-step temperature varying program are described. It should be appreciated that this invention may be embodied in many different forms; for example, in an actual application, a temperature varying program with more than three steps may be applied in a deposition process.

Fourth Embodiment

According to the fabrication method of a porous low-k dielectric layer of this embodiment of the present invention, a backbone precursor of the dielectric matrix is continuously provided and the deposition process which is controlled under a pressure varying program and a porogen species is performed to form a porous low-k dielectric layer with different physical characteristics.

Figure 5:
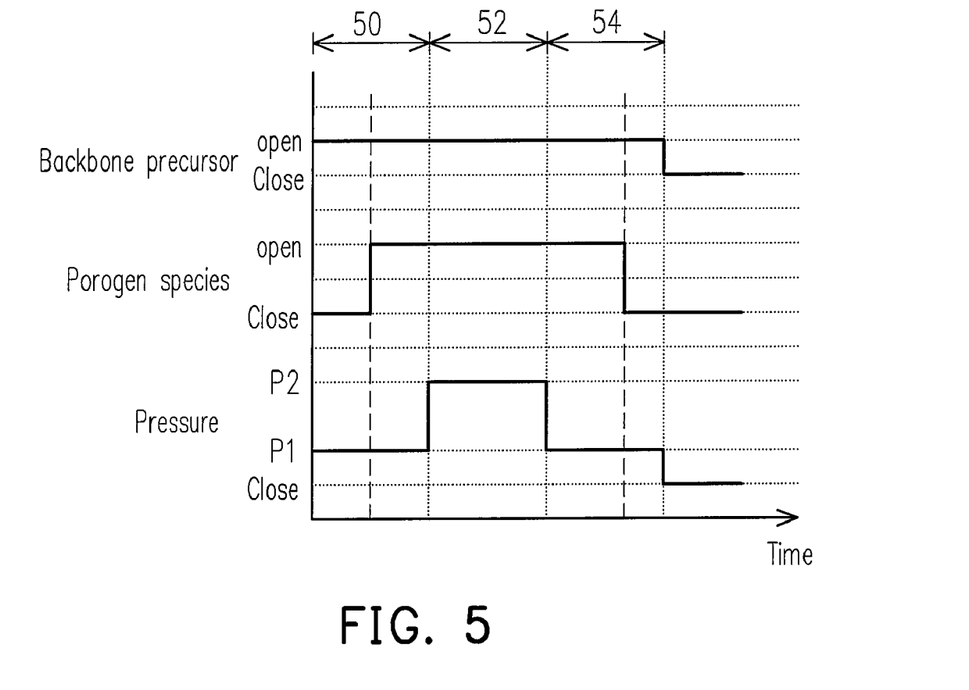
FIG. 5 is a schematic diagram illustrating a deposition process performed with a three-step pressure varying program with a low pressure step, followed by a high pressure step and then by a low pressure step according to a fourth embodiment of the present invention.

Referring to FIG. 5, in an embodiment of the present invention, the pressure varying program includes a gradient pressure varying program with three pressure steps. The three pressure steps include sequentially a first pressure step 50, a second pressure step 52 and a third pressure step, wherein the first pressure step 50 includes a low pressure step, the second pressure step 52 includes a high pressure step, and the third pressure step 54 is a low pressure step. The first and the third pressure steps may conduct at the same or different pressures. As shown in FIG. 5, only the first and the third pressure steps being conducted at the same pressure are illustrated. In one embodiment, the first pressure step 50, which is a low pressure step, is conducted at a pressure of about 1 to about 9 torrs; the second pressure step 52, which is a high pressure step, is conducted at a pressure of about 9 to 20 torrs; the third pressure step, which is a low pressure step, is conducted at a pressure of about 1 to 9 torrs.

Figure 5A:
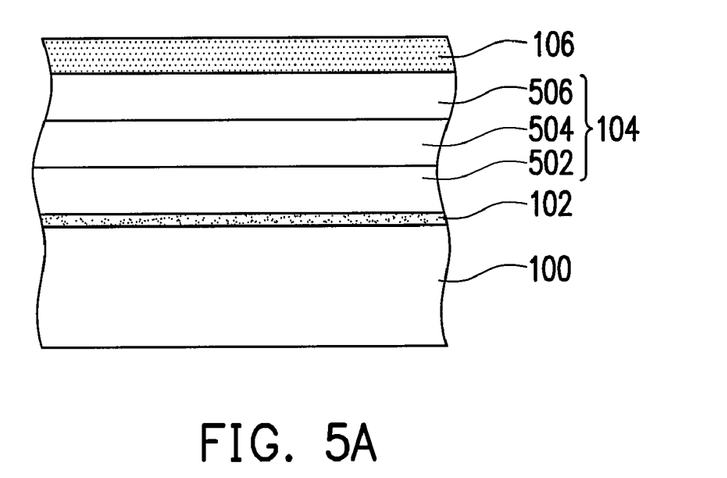
FIG. 5A is a schematic, cross-sectional view diagram of a dielectric layer formed according to a deposition process performed with a three-step pressure varying program with a low pressure step, followed by a high pressure step and then a low pressure step according to a fourth embodiment of the present invention.

During each of the pressure steps 50, 52, 54, the dielectric layer may form with different characteristics by adjusting the concentration of the porogen species in the dielectric matrix. FIG. 5A is a schematic view of a sandwiched type of dielectric layer, which contains a porous low-k material according to a fourth embodiment of the present invention.

Referring to both FIGS. 5 and 5A, in one embodiment of the invention, during the front end process of the first pressure step 50, the dielectric matrix being provided includes a backbone precursor but not a porogen species to form a low-k dielectric layer 502. When the backend process of the first pressure step 50, the entire second pressure step 52, and the front end process of the third pressure step 54 are being performed, the dielectric matrix being provided includes the backbone precursor and the porogen species to form a low-k dielectric layer 504. During the backend process of the third pressure step, the dielectric matrix, including the backbone precursor but not the porogen species, is being provided to form a low-k dielectric layer 506. The dielectric matrix of the front end process of the first pressure step and the backend process of the third pressure step includes only the backbone precursor but not the porogen species. Hence, the low k dielectric layers 502, 506 are rigid low-k dielectric layers. On the other hand, the dielectric matrix of the entire second pressure step 52 and the front end of the third pressure step 5 includes not only the backbone precursor but also the porogen species. Hence, the low-k dielectric layer 504 is a porous low-k dielectric layer. In other words, the low-k dielectric layers 502, 504, 506 form a sandwich stacked layer with a dense upper layer, a dense lower layer and a loose middle layer.

The thickness of each low-k dielectric layer 502, 504, 506 is highly related to the duration of each pressure step 50, 52, 54, and the timing and duration of the porogen species that are being provided to the process. Each step 50, 52 and 54 may perform in-situ at the same deposition station or non in-situ at different deposition stations. The duration for each step 50, 52, 54 may be modified according to the deposition station or the requirement of the process. For example, when there are four deposition stations in one deposition chamber, the ratio of the deposition station used for the first process step 50 to that for the second process step 52 and to that for the third process step 54 may be 1:2:1, 2:1:1 or 1:1:2. If the deposition time at each deposition station is fixed, the ratio of the deposition time for the first pressure step 50 to that of the second pressure step 52 and to that of the third pressure step 54 is 1:2:1, 2:1:1 or 1:1:2. If a plurality of deposition chambers is arranged in series, more deposition stations are available. The number of deposition station and the deposition time for the first temperature step 50, the second temperature step 52 and the third temperature step 54 can be modified according to the actual demands and requirements.

Experimental results confirm that the application a three-step pressure varying program with a low pressure step-a high pressure step-a low pressure step to perform a deposition process, a sandwich type of porous low-k dielectric layer 104 having a dielectric constant below 2.5 is formed. Hence, the resulting dielectric layer has superior electrical efficiency or stability, for example, the DD result and the DD stability of the sandwich type, porous low-k dielectric layer 104 are superior to those of a double layer of low-k dielectric layer (an upper layer being a rigid low k dielectric layer and a lower layer being a porous low-k dielectric layer) or a single layer of porous low-k dielectric layer.

In one embodiment, during each step of the deposition process, a single frequency radio frequency power is applied. For example, only the high frequency radio frequency power is activated, while the low frequency radio frequency power is turned off. In another embodiment, dual frequency radio frequency power is employed in each temperature step. In essence, during the deposition process, the low frequency radio frequency power and the high frequency radio frequency power are concurrently applied. The power of the low frequency radio frequency power is about 200 W to about 2500 W, for example, and the voltage is about 100 KHz to about 500 KHz, for example. The power of the high frequency radio frequency power is about 2000 W to about 5000 W, for example, and the voltage is about 10 MHz to about 50 MHz, for example. Using the dual frequency radio frequency power to perform each step of the deposition process, the step coverage of the metal barrier layer at the interface between the dielectric barrier layer and the porous low-k dielectric layer 104 (the porous low-k dielectric layer 502) is improved when the metal barrier layer is deposited in a dual damascene opening. The mechanical strength of the porous low-k dielectric layer 104, the adhesion property and the etching selectivity between the porous low-k dielectric layer 104 and the barrier layer 102 are also reinforced. Experimental results confirm that using a dual radio frequency power to perform each step of the deposition process, the kink profile issue between the porous low-k dielectric layer 104 and the overlying layer 102 and between the porous low-k dielectric layer 104 and the underlying layer 106 in the subsequent etching process can be improved.

In the above embodiments, only a single three-step pressure varying program with a low pressure step, a high pressure step and a low pressure step is being described. It should be appreciated that the present invention may be embodied in many different forms; for example, in an actual application, a pressure varying program with more than three steps may be applied in a deposition process.

According to the fabrication method of a dielectric layer of the present invention, the porous low-k dielectric layer with an ultra low dielectric constant, a lower tensile stress, and excellent or stable electrical efficiency and reliability is being provided. Further, the porous low-k dielectric layer of the present invention has excellent adhesion with the underlying and overlying layers. Hence, the kink profile issue between the porous low k dielectric layer of the present invention and the overlying layer or the underlying layer is greatly improved. Moreover, the fabrication method of a dielectric layer of the present invention is simple and easily controlled.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating an ultra low dielectric constant (k) dielectric layer, the method comprising:
   performing a deposition process with a dielectric matrix and a porogen, wherein the deposition process is controlled by a temperature varying program for the dielectric matrix and the porogen to react to form a plurality of porous low-k dielectric layers stacked on a dielectric barrier layer above a substrate;
   wherein the temperature varying program is a gradient temperature varying program comprising a plurality of temperature steps, the stacked porous low-k dielectric layers are formed by the dielectric matrix cooperative with the porogen during the temperature steps respectively and thereby each adjacent two of the stacked porous low-k dielectric layers have different porosity densities.

2. The method of claim 1, wherein the gradient temperature varying program comprises two temperature steps that include a low temperature step and a high temperature step.

3. The method of claim 2, wherein the low temperature step is conducted at a temperature of about 200 to about 250 degrees Celsius, and the high temperature step is conducted at a temperature of about 250 to about 350 degrees Celsius.

4. The method of claim 2, wherein the gradient temperature varying program includes performing the high temperature step, followed by performing the low temperature step to mitigate kink profile issue between the ultra low-k dielectric layer and an overlying layer.

5. The method of claim 2, wherein the gradient temperature varying program includes performing the low temperature step, followed by performing the high temperature step to increase a breakdown voltage of device.

6. The method of claim 1, wherein the gradient temperature varying program includes three temperature steps.

7. The method of claim 6, wherein the three temperature steps comprises sequentially a first low temperature step, a high temperature step and a second low temperature step to reduce a stress of the porous low-k dielectric layers.

8. The method of claim 7, wherein the first and the second low temperature steps are conducted at about 200 to about 230 degrees Celsius and the high temperature step is conducted at about 230 to about 400 degrees Celsius.

9. The method of claim 1, wherein a single frequency radio frequency or a dual frequency radio frequency power are used during the deposition process.

10. A method of fabricating an ultra low dielectric constant (k) dielectric layer, the method comprising:
performing a deposition process with a dielectric matrix, wherein the deposition process is controlled by a pressure varying program for the dielectric matrix to react to form a plurality of porous low-k dielectric layers having a density gradient on a dielectric barrier layer above a substrate;
wherein the pressure varying program is a gradient pressure varying program comprising three pressure steps;
wherein the three pressure steps comprise sequentially a first low pressure step, a high pressure step and a second low pressure step for improving electrical efficiency and stability of the porous low-k dielectric layers.

11. The method of claim 10, wherein the first and the second pressure steps are conducted at a pressure of about 1 to about 9 torrs, and the high pressure step is conducted at a pressure of about 9 to about 20 torrs.

12. The method of claim 10, wherein
during a front end process of the first low pressure step, the dielectric matrix comprises a backbone precursor but not a porogen species to form a first dense one of the porous low-k dielectric layers;
during a backend process of the first low pressure step, the high pressure step and a front end process of the second low pressure step, the dielectric matrix comprises the backbone precursor and the porogen species to form a loose one of the porous low-k dielectric layers; and
during a backend process of the second low pressure step, the dielectric matrix comprises the precursor but not the porogen species to form a second dense one of the porous low-k dielectric layers.

* * * * *